(12) United States Patent
Seddon

(10) Patent No.: US 12,230,543 B2
(45) Date of Patent: Feb. 18, 2025

(54) DIE CLEANING SYSTEMS AND RELATED METHODS

(71) Applicant: SEMICONDUCTOR COMPONENTS INDUSTRIES, LLC, Scottsdale, AZ (US)

(72) Inventor: Michael J. Seddon, Gilbert, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

(21) Appl. No.: 18/505,215

(22) Filed: Nov. 9, 2023

(65) Prior Publication Data

US 2024/0079274 A1 Mar. 7, 2024

Related U.S. Application Data

(62) Division of application No. 16/929,542, filed on Jul. 15, 2020, now Pat. No. 11,854,889, which is a (Continued)

(51) Int. Cl.
*H01L 21/78* (2006.01)
*B23K 26/00* (2014.01)
(Continued)

(52) U.S. Cl.
CPC ........ *H01L 21/78* (2013.01); *H01L 21/02076* (2013.01); *H01L 21/268* (2013.01); *H01L 21/3043* (2013.01); *H01L 21/6836* (2013.01); *H01L 23/544* (2013.01); *B23K 26/0006* (2013.01); *B23K 26/53* (2015.10); *B23K 2101/40* (2018.08); *H01L 2223/5446* (2013.01)

(58) Field of Classification Search
None
See application file for complete search history.

(56) References Cited

U.S. PATENT DOCUMENTS 9,481,051 B2  11/2016  Hirata et al.
9,620,415 B2   4/2017  Hirata et al.
(Continued)

FOREIGN PATENT DOCUMENTS

CN  106463387 B   2/2017
JP  2001-341122 A 12/2001
(Continued)

OTHER PUBLICATIONS

"SDBG (Stealth Dicing Before Grinding) Process," Disco Corporation, available at https://www.disco.co.jp/eg/solution/library/sdbg.html, last visited May 17, 2018.
(Continued)

*Primary Examiner* — Khaja Ahmad
(74) *Attorney, Agent, or Firm* — IPTechLaw

(57) ABSTRACT

Implementations of methods of forming a plurality of semiconductor die may include forming a damage layer beneath a surface of a die street in a semiconductor substrate, singulating the semiconductor substrate along the die street into a plurality of semiconductor die, and removing one or more particulates in the die street after singulating through applying sonic energy to the plurality of semiconductor die.

20 Claims, 4 Drawing Sheets

Related U.S. Application Data division of application No. 15/988,874, filed on May 24, 2018, now abandoned.

(51) Int. Cl.
*B23K 26/53* (2014.01)
*B23K 101/40* (2006.01)
*H01L 21/02* (2006.01)
*H01L 21/268* (2006.01)
*H01L 21/304* (2006.01)
*H01L 21/683* (2006.01)
*H01L 23/544* (2006.01)

(56) References Cited

U.S. PATENT DOCUMENTS

| | | | |
|---|---|---|---|
| 9,808,884 B2 | 11/2017 | Hirata et al. | |
| 9,815,138 B2 | 11/2017 | Hirata | |
| 9,868,177 B2 | 1/2018 | Hirata | |
| 9,878,397 B2 | 1/2018 | Hirata et al. | |
| 2003/0200987 A1 | 10/2003 | Cheung et al. | |
| 2005/0040442 A1* | 2/2005 | Andreas | H01L 23/544 |
| | | | 257/253 |
| 2005/0101109 A1* | 5/2005 | Chin | B23K 26/40 |
| | | | 438/464 |
| 2005/0236378 A1 | 10/2005 | Boyle et al. | |
| 2006/0032332 A1 | 2/2006 | Ohnishi | |
| 2007/0066188 A1* | 3/2007 | Nitta | B28D 5/047 |
| | | | 451/41 |
| 2007/0155131 A1 | 7/2007 | Contes | |
| 2008/0213978 A1 | 9/2008 | Henry et al. | |
| 2009/0121337 A1* | 5/2009 | Abe | H01L 21/268 |
| | | | 257/E21.237 |
| 2011/0124180 A1* | 5/2011 | Abe | H01L 21/67092 |
| | | | 257/E21.599 |
| 2012/0156816 A1 | 6/2012 | Okamura et al. | |
| 2014/0147624 A1 | 5/2014 | Streltsov et al. | |
| 2015/0162222 A1 | 6/2015 | Obata | |
| 2016/0096155 A1 | 4/2016 | Sharma et al. | |
| 2016/0228984 A1 | 8/2016 | Hirata et al. | |
| 2016/0228985 A1 | 8/2016 | Hirata et al. | |
| 2016/0288250 A1 | 10/2016 | Hirata et al. | |
| 2016/0288251 A1 | 10/2016 | Hirata et al. | |
| 2016/0293397 A1 | 10/2016 | Hirata et al. | |
| 2016/0305042 A1 | 10/2016 | Hirata | |
| 2016/0307763 A1 | 10/2016 | Hirata | |
| 2016/0354862 A1 | 12/2016 | Hirata | |
| 2017/0015017 A1 | 1/2017 | Hirata | |
| 2017/0025275 A1 | 1/2017 | Hirata et al. | |
| 2017/0025276 A1 | 1/2017 | Hirata | |
| 2017/0053829 A1* | 2/2017 | Hirata | H01L 21/0475 |
| 2017/0066078 A1* | 3/2017 | Morikazu | B23K 26/356 |
| 2017/0136572 A1 | 5/2017 | Hirata | |
| 2017/0151627 A1 | 6/2017 | Hirata | |
| 2017/0154768 A1* | 6/2017 | Zhao | H01L 21/67132 |
| 2017/0198411 A1 | 7/2017 | Hirata | |
| 2017/0291255 A1 | 10/2017 | Hirata | |
| 2017/0348796 A1 | 12/2017 | Nishino et al. | |
| 2017/0352781 A1 | 12/2017 | Obuchi et al. | |
| 2018/0161737 A1* | 6/2018 | Tachibana | B01F 25/20 |
| 2018/0161921 A1* | 6/2018 | Morikazu | H01L 31/202 |
| 2018/0308819 A1 | 10/2018 | Uzoh | |

FOREIGN PATENT DOCUMENTS

| | | |
|---|---|---|
| JP | 2016-146446 A | 8/2016 |
| JP | 2016-146447 A | 8/2016 |
| JP | 2016-146448 A | 8/2016 |
| JP | 2016-151457 A | 8/2016 |
| JP | 2016-197698 A | 11/2016 |
| JP | 2016-197699 A | 11/2016 |
| JP | 2016-197700 A | 11/2016 |
| JP | 2016-198788 A | 12/2016 |
| JP | 2016-207702 A | 12/2016 |
| JP | 2016-207703 A | 12/2016 |
| JP | 2016-225535 A | 12/2016 |
| JP | 2016-225536 A | 12/2016 |
| JP | 2017-005008 A | 1/2017 |
| JP | 2017-022283 A | 1/2017 |
| JP | 2017-024014 A | 2/2017 |
| JP | 2017-024039 A | 2/2017 |
| JP | 2017-024188 A | 2/2017 |
| JP | 2017-028072 A | 2/2017 |
| JP | 2017-041481 A | 2/2017 |
| JP | 2017-041482 A | 2/2017 |
| JP | 2017-057103 A | 3/2017 |
| JP | 2017-092314 A | 5/2017 |
| JP | 2017-121742 A | 7/2017 |
| JP | 2017-123405 A | 7/2017 |
| JP | 2017-188586 A | 10/2017 |
| JP | 2017-189870 A | 10/2017 |
| JP | 2017-215303 A | 12/2017 |
| JP | 2017-216423 A | 12/2017 |
| JP | 2017-216424 A | 12/2017 |
| JP | 2017-220631 A | 12/2017 |

OTHER PUBLICATIONS

"Dicing Application with Ultrasonic Technology," Disco Corporation, available at http://www.disco.co.jp/eg/solution/library/usw.html, last visited May 17, 2018.

Kanegsberg et al., "Ultrasonics vs. Megasonics," Solid State Technology, available at http://electroiq.com/blog/2002/07/ultrasonics-vs-megasonics/, Jul. 2002, last visited Apr. 25, 2018.

Busnaina et al., Ultrasonic and Megasonic Particle Removal, Precision Cleaning 1995 Proceedings, 347, 1995.

* cited by examiner

DIE CLEANING SYSTEMS AND RELATED METHODS

CROSS REFERENCE TO RELATED APPLICATIONS

This application is a divisional application of the earlier U.S. Utility Patent Application to Michael J. Seddon entitled "Die Cleaning Systems and Related Methods," application Ser. No. 16/929,542, filed Jul. 15, 2020, now pending, which application is a divisional application of the earlier U.S. Utility Patent Application to Michael J. Seddon entitled "Die Cleaning Systems and Related Methods," application Ser. No. 15/988,874, filed May 24, 2018, the disclosures of each of which are hereby incorporated entirely herein by reference.

BACKGROUND

1. Technical Field

Aspects of this document relate generally to systems and methods for singulating die from semiconductor substrates.

2. Background

Semiconductor devices are typically formed on and into the surface of a semiconductor substrate. As the semiconductor substrate is typically much larger than the devices, the devices are singulated one from another into various semiconductor die. Sawing the semiconductor substrate is a method used to separate the semiconductor die from each other.

SUMMARY

Implementations of methods of forming a plurality of semiconductor die may include forming a damage layer beneath a surface of a die street in a semiconductor substrate, singulating the semiconductor substrate along the die street into a plurality of semiconductor die, and removing one or more particulates in the die street after singulating through applying sonic energy to the plurality of semiconductor die.

Implementations of methods of forming a plurality of semiconductor die may include one, all, or any of the following:

The semiconductor substrate may be silicon carbide.

Forming a damage layer may further include irradiating the die street with a laser beam at a focal point within the semiconductor substrate at one or more spaced apart locations beneath the surface of the die street to form the damage layer.

Forming a damage layer may further include irradiating the die street with a laser beam at a focal point at a first depth within the semiconductor substrate at one or more spaced apart locations beneath the surface of the die street and irradiating the die street with a laser beam at a focal point at a second depth within the semiconductor substrate at one or more spaced apart locations beneath the surface of the die street.

Singulating the semiconductor substrate may include sawing the semiconductor substrate.

The method may include ablating a portion of the material of the die street using a laser.

The semiconductor substrate may be singulated using stealth dicing.

Applying sonic energy may include applying sonic energy between 20 kHz to 3 GHz.

Implementations of methods of forming a plurality of semiconductor die may include irradiating a semiconductor substrate with a laser beam at a focal point below a die street to form a damage layer, sawing the semiconductor substrate along the die street into a plurality of semiconductor die, and removing one or more particulates in the die street after singulating through applying sonic energy to the plurality of semiconductor die.

Implementations of methods of forming a plurality of semiconductor die may include one, all, or any of the following:

Applying sonic energy may include applying sonic energy between 20 kHz to 3 GHz.

The semiconductor substrate may be silicon carbide.

The method may include ablating a portion of the material of the die street using a laser.

Forming a damage layer may further include irradiating the die street with a laser beam at a focal point at a first depth within the semiconductor substrate at one or more spaced apart locations beneath the surface of the die street and irradiating the die street with a laser beam at a focal point at a second depth within the semiconductor substrate at one or more spaced apart locations beneath the surface of the die street.

The method may include spraying the plurality of semiconductor die with a liquid while applying the sonic energy.

The method may include applying sonic energy to the saw blade while cutting the semiconductor substrate.

Implementations of methods of forming a plurality of semiconductor die may include singulating a silicon carbide semiconductor substrate along a die street into a plurality of semiconductor die, applying sonic energy to the silicon carbide semiconductor substrate, and removing one or more particulates in the die street after singulating the silicon carbide semiconductor substrate through applying sonic energy to the plurality of semiconductor die.

Implementations of methods of forming a plurality of semiconductor die may include one, all, or any of the following:

Applying sonic energy may include applying sonic energy between 20 kHz to 3 GHz.

Applying sonic energy to the silicon carbide semiconductor substrate may include directly applying sonic energy to a spindle coupled with a chuck coupled to the silicon carbide semiconductor substrate.

The method may include either spraying the plurality of semiconductor die with a liquid while applying the sonic energy or immersing the plurality of semiconductor die in a liquid while applying the sonic energy.

The semiconductor substrate may be singulated using stealth dicing.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 4 is a cross-sectional side view of a semiconductor substrate after having been cut through;

FIG. 8 is a cross-sectional side view of a semiconductor substrate after having been cut through.

DESCRIPTION

This disclosure, its aspects and implementations, are not limited to the specific components, assembly procedures or method elements disclosed herein. Many additional components, assembly procedures and/or method elements known in the art consistent with the intended semiconductor die will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor die, and implementing components and methods, consistent with the intended operation and methods.

A wide variety of semiconductor substrate types exist and are used in the process of manufacturing various semiconductor devices. Non-limiting examples of semiconductor substrates that may be processed using the principles disclosed in this document include single crystal silicon, silicon dioxide, glass, silicon-on-insulator, gallium arsenide, sapphire, ruby, silicon carbide, polycrystalline or amorphous forms of any of the foregoing, and any other substrate type useful for constructing semiconductor devices. Particular implementations disclosed herein may utilize silicon carbide semiconductor substrates (silicon carbide substrates) of any polytype. In this document the term "wafer" is also used along with "substrate" as a wafer is a common type of substrate, but not as an exclusive term that is used to refer to all semiconductor substrate types. The various semiconductor substrate types disclosed in this document may be, by non-limiting example, round, rounded, square, rectangular, or any other closed shape in various implementations.

Figure 1:
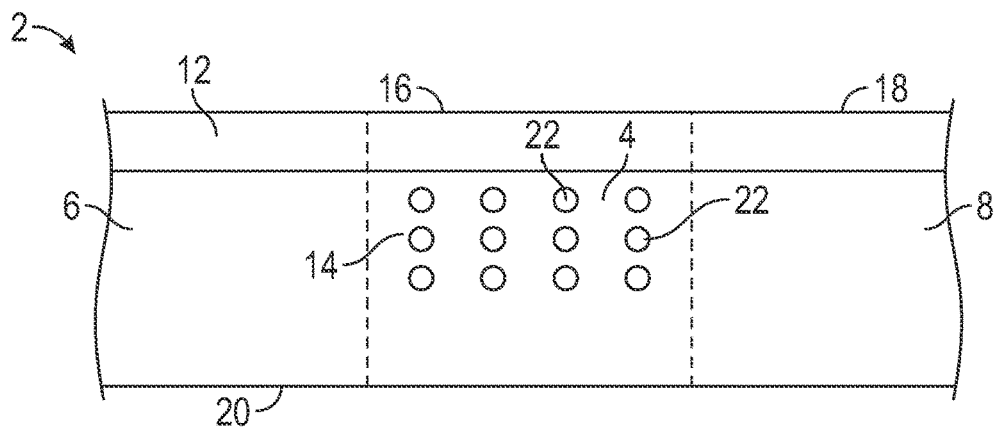
FIG. 1 is a cross-sectional side view of an implementation of a damaged die street in a semiconductor substrate.

Referring to FIG. 1, a cross-sectional side view of an implementation of a damaged die street 4 in a semiconductor substrate 2 is illustrated. As illustrated, the street 4 is the area of the semiconductor substrate 2 between die 6 and 8 and extends across the thickness of the semiconductor substrate 2. Since this is a cross sectional view, just two die 6, 8 are visible in this view, but the street extends across a plurality of die spaced apart across the surface of the semiconductor substrate 2. In various implementations, the semiconductor substrate 2 may include a device layer 12. The device layer may include a plurality of power semiconductor devices, such as, by non-limiting example, a MOSFET, an IGBT, a thyristor, any other power semiconductor device, and any combination thereof. In other implementations, one or more of the plurality of semiconductor devices may include a non-power semiconductor device.

In various implementations, the method of forming a plurality of semiconductor die may include forming a damage layer 14 beneath a surface 16 of the die street 4 in the semiconductor substrate 2. The damage layer may be formed from either the front side 18 or the backside 20 of the semiconductor substrate 2. In various implementations, the forming the damage layer 14 may include forming a plurality of perforations 22, or holes, within the damage layer 14. In other implementations, no holes are formed in the saw street but a portion of the material in the saw street may still be damaged or altered to a weaker condition. In various implementations, the damage layer may be formed through a laser, etching, heating of the material of the street, cooling of the material of the street, implanting the material of the street, or any other method useful for disrupting the crystalline structure of the die street. In implementations where a laser is used, the laser beam may irradiate the material of the street 4 at a focal point beneath a surface 16 of the street 4. Because the laser beam causes localized heating at the focal point, the crystalline structure of the material at the focal point becomes disrupted. In other implementations, the method may include ablating the material, damaging the material, or ablating and damaging the material using a laser. The laser may include parameters the same as or similar to any parameters of any laser disclosed herein.

As illustrated by FIG. 1, the damage layer 14 may not extend all the way through the saw street 4, but may be concentrated near the surface corresponding with the source of the damage. Thus, as illustrated by FIG. 1, assuming the damage layer was formed via a laser, the laser irradiated the semiconductor substrate 2 through the device layer 12. In other implementations, the damage may be formed from the backside 20 of the semiconductor substrate 2. While the damage in FIG. 1 is illustrated as being at discrete points or holes, in various implementations, the damage may be distributed continuously or semi-continuously through the material of the die street. In other implementations, the damage layer may extend through the entire depth of the saw street 4. In various implementations, and as illustrated by FIG. 1, the damage layer 4 may be formed across the width of the saw street 4 and may be continuous or semi-continuous. However, in other implementations, such as the implementation illustrated by FIG. 2, the damage layer may be formed only near the sidewalls of the semiconductor die.

Figure 2:
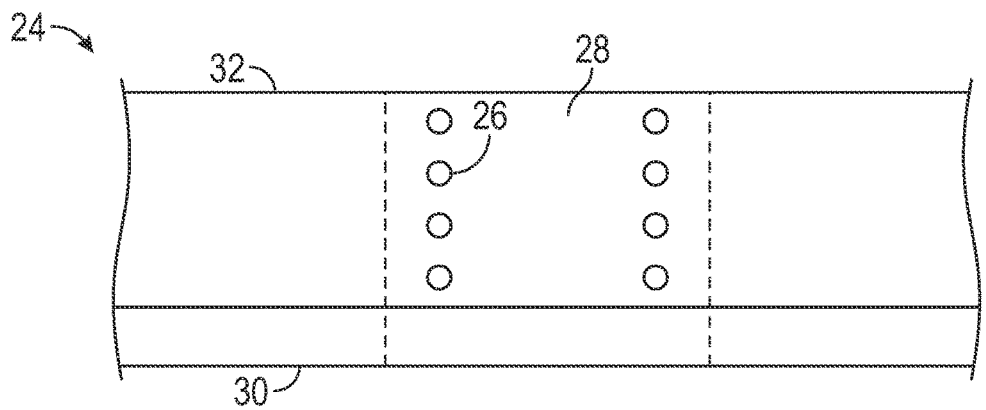
FIG. 2 is a cross-sectional side view of a second implementation of a damaged die street in a semiconductor substrate.

Referring to FIG. 2, a cross-sectional side view of a second implementation of a damaged die street in a semiconductor substrate 24 is illustrated where the damage 26 is only near the sidewalls of the die street 28. The damage 26 may extend substantially entirely through a depth of the die street 28, as illustrated by FIG. 2, while in other implementations the damage 26 may be located closer to a front side 30 or a backside 32 of the semiconductor substrate 24. In still other implementations, the method of forming a plurality of semiconductor die may not include forming a damage layer in the die street, rather, the semiconductor substrate may be singulated without forming any kind of damage in the die street.

In various implementations, the method may include forming a scribe mark in a top surface of the die street with a stylus. Depending on the pressure, speed, and/or tip characteristics of the stylus, the scribe mark may result in removal of material from the street and/or the formation of a crack that propagates down into the material of the street from the scribe mark following the crystal structure of the semiconductor substrate. The stylus may be both used in implementations of die streets of semiconductor substrates already having a damage layer as well as implementations where the stylus is used to create the damage layer within the die street.

Figure 3:
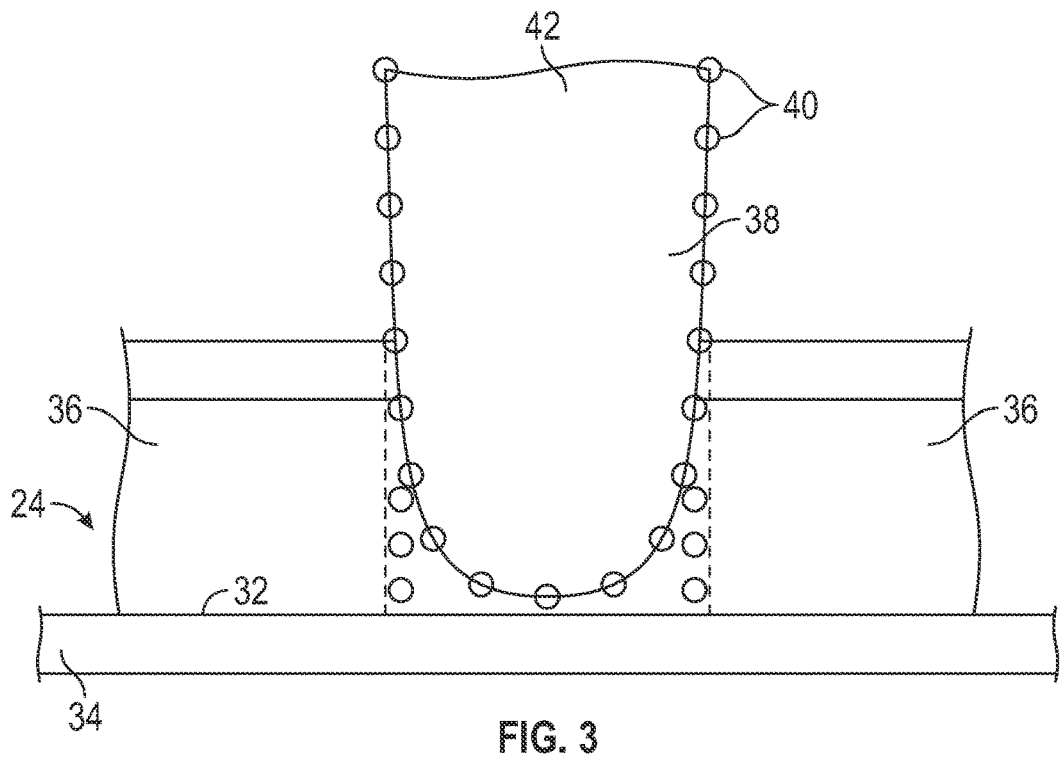
FIG. 3 is a cross-sectional side view of a saw cutting through the die street of FIG. 2.

Referring to FIG. 3, a cross-sectional side view of a saw cutting through the die street of FIG. 2 is illustrated. The method of forming a plurality of semiconductor die may include coupling the backside 32 to a chuck 34 or platform used to support the semiconductor substrate 24. The method may also include singulating the semiconductor substrate 24 along the die street 28 into a plurality of semiconductor die 36. In various implementations, and as illustrated by FIG. 3, a saw blade 38 may be used to singulate the semiconductor substrate 24. As illustrated, the sawing of the substrate takes place once the substrate has been mounted on cutting tape and oriented device side up from the orientation in FIG. 2. As illustrated, in various implementations the saw blade 38 is made of a composite material that includes a binding matrix 42 that holds particles of diamond grit 40 therein. During the sawing process, the material of the matrix 42 wears away exposing the diamond grit 40 particles, which also eventually fall out of their place in the blade after being used in the sawing process for a time. In this way, fresh diamond particles are constantly being exposed and available for use during the entire lifetime of the blade. The damage layers weaken the crystal structure of the semiconductor substrate, and so allow the blade to remove the material in the street more easily. Since the material is easier to remove, then less wear on the blade occurs and the blade lifetime can be increased. Also, in some implementations, the saw process may be able to take place more quickly since the material can be removed more quickly. Since the saw blade 38 is a consumable as it wears over time and requires changing, increasing the blade lifetime and/or increasing the number of substrates which can be cut using the saw blade can reduce the processing cost per substrate. In other implementations, other saw blades made of different materials may be used. Such saw blades may or may not include the diamond grit 40.

During the sawing process, particularly for hard substrates such as silicon carbide, the saw blade can glaze or otherwise prevent the material of the matrix from properly abrading (due to accumulation of material from the cutting tape and/or material from the substrate being sawn), causing the blade to no longer be bringing new diamond grit particles to the surface of the blade. This reduces the effectiveness of the blade when cutting, decreasing cutting speed and/or causing increased sidewall damage to the die, which can reduce die strength, particularly for thinned die. In various implementations, a sonic energy assisted sawing system may be utilized. In such implementations, a sonic energy source may be coupled with a spindle that is rotatably coupled with saw blade. During operation, the sonic energy from the sonic energy source is transmitted down the spindle as vibrational energy causing the saw blade to correspondingly vibrate during operation. As a result, the matrix vibrates against the material of the substrate being cut and abrades more easily, allowing fresh pieces of diamond grit to be more readily exposed. Also, in various implementations, the sawn slurry material of the substrate itself can act as grit against the blade due to the vibration action and also assist in the cutting process of unsawn substrate material as well. The observed effect of sonic energy enhanced sawing is that the sawing process proceeds more quickly, blade lifetimes are longer, and/or the sidewall damage observed following the sawing process is reduced. Also, for substrates where the Mohs hardness of the material being sawn is close to the hardness of the diamond grit (like silicon carbide), the benefits of using sonic enhanced singulation may be particularly advantageous, due to the generally slow sawing process and high blade wear rates observed for such materials. The effect of the increased efficiency of the cutting process where sonic energy is applied to the spindle can be observed in lower spindle currents being required during the sawing process. The parameters of the sonic energy applied may be the same as or similar to any parameters of any sonic energy disclosed herein.

In other implementations, the method of forming a plurality of semiconductor die may include singulating the semiconductor die through other methods or processes aside from cutting or sawing the semiconductor substrate. In implementations where a score mark is formed in the die street using a stylus, the semiconductor substrate can be stretched or flexed through mounting the substrate onto cutting tape or die attach film and stretching the film. In this way, the cracks formed by the scribe mark then complete propagating through the thickness of the substrate thus singulating the plurality of die which can then be picked from the tape. The ability for the scribe mark to create a crack capable of permitting direct scribe and break separation using a process like this depends on the crystallographic orientation of the crystal planes of the particular semiconductor substrate being used (and whether the substrate is a single crystal substrate or not). In some substrates, since the crack will follow the path of least resistance, the crack may actually attempt to propagate at some angle from the scribe mark into the die. In such implementations, the scribe mark may simply be used as a material removal/additional street damage technique to aid in further damaging the material in the street and/or removing material before sawing using a saw blade using any of the techniques disclosed in this document. The use of the scribing technique may improve die strength as it may reduce the amount of material sawn or eliminate the need for saw, depending on the crystallography of the particular semiconductor substrate. Such implementations may also be combined with the various sawing implementations disclosed herein.

The method of forming a plurality of semiconductor die may include singulating the semiconductor die through stealth dicing. As used herein, stealth dicing may include forming a damaged or modified layer within the die street of a semiconductor substrate. The damaged layer may be formed using any method disclosed herein. After the damaged layer is formed, stealth dicing may include coupling the semiconductor substrate to a tape expander. The semiconductor substrate may then be expanded resulting in singulation of the semiconductor substrate along the damaged die street into a plurality of die. Stealth dicing may increase the number of die formed from the semiconductor substrate as the die street may be narrower than that which a saw blade can produce due to saw blade width, saw kerf width, and other factors controlling the ultimate width of a saw cut street.

The method of forming a plurality of semiconductor die may include singulating the semiconductor die through etching. In various implementations, the semiconductor substrate may be singulated using a wet etch or a dry etch. In still other implementations, the method of forming a plurality of semiconductor die may include singulating the die through ablating portions of the die street. In such implementations, following creating of the damage layer, a laser beam configured to ablate the material of the street using, by non-limiting example, a particular laser type, beam width, pulse energy, repetition rate, power, and any other laser parameter may be passed across the material of the street. Also, in some implementations, a jet of gas may be applied at the focal point of the ablation laser beam. In some implementations, this jet of gas may be at ambient temperature and designed to blow the slag from the laser in a desired direction either out of the laser beam or relative to the street. In other implementations, the jet of gas may be cooled relative to ambient temperature and/or a temperature of the substrate and may act to thermally shock the substrate at the point at or close behind the heated ablation point. In these implementations, the remaining material of the street may fracture along the crystallographic plane of least resistance and result in singulation of the die on each side of the street from each other. Where cold gas is used, less ablation by the laser may be needed to achieve singulation of the die, which can reduce the amount of slag deposited on the die and/or increase the ultimate die strength following singulation.

Figure 4:
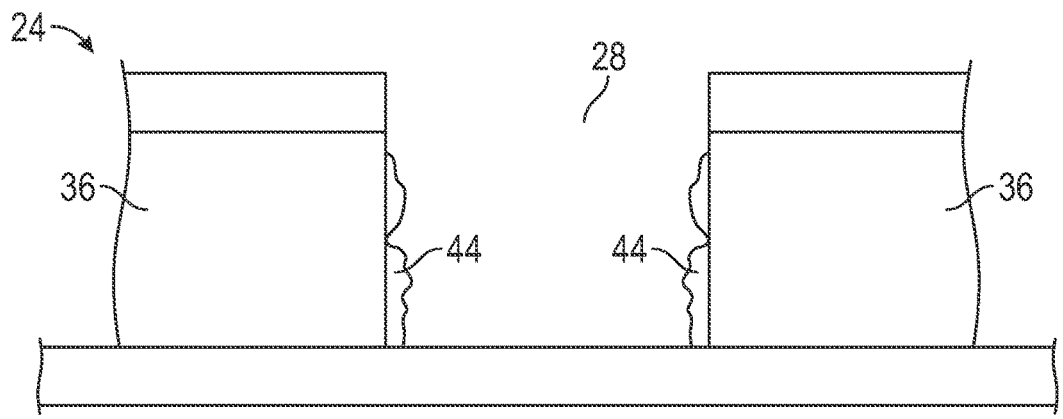

Referring to FIG. 4, a cross-sectional side view of a semiconductor substrate after having been singulated is illustrated. In various implementations, after singulating the plurality of semiconductor die 36, variously sized particulates/slivers/chips 44 may be coupled to the sidewalls of the plurality of semiconductor die. The particulates 44 may be remnants of the die street 28, tape, backmetal, or any other contamination or material from the substrate. Such particulates 44 may prove problematic as they may flake off after the singulation process and/or during the assembly process. In various implementations, such particulates may contaminate waste water (particularly those that contain copper). Further, if a mold compound of a semiconductor package is coupled to the particulates 44, the particulates 44 may break off from the remainder of the semiconductor substrate and may compromise the structure of the final chip.

Figure 5:
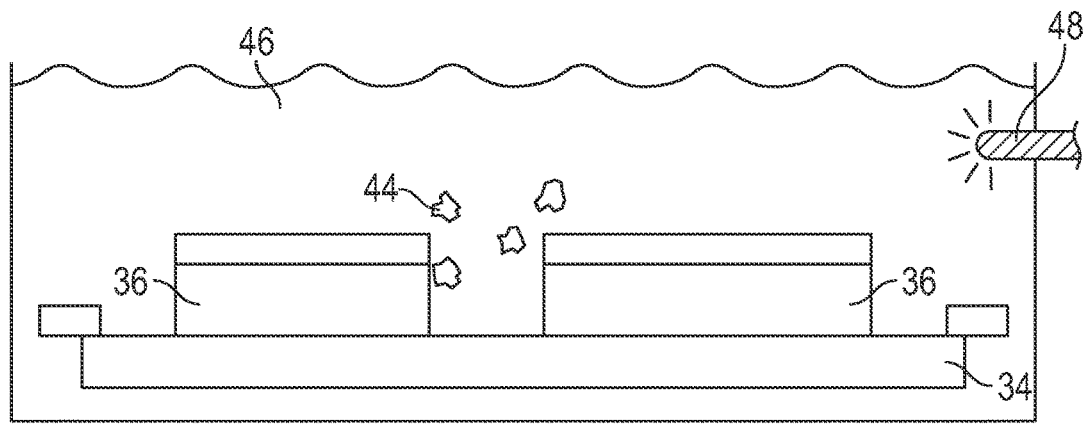
FIG. 5 is a cross-sectional side view of a semiconductor substrate submersed in a liquid with sonic energy applied to the liquid.

Referring to FIG. 5, a cross-sectional side view of a semiconductor substrate submersed in a liquid with sonic energy applied to the liquid is illustrated. In various implementations, the method may include immersing the plurality of semiconductor die 36 in a liquid 46. The liquid 46 may include, by non-limiting example, water, a surfactant, a mixture of water and surfactant, and/or any other solvent and/or solute. As illustrated by FIG. 5, the tape 34 may also be immersed in the liquid. In various implementations, the plurality of semiconductor die 36 on the tape 34 may be held or supported in the bath or other container in which they are submerged using a chuck (which may be a vacuum chuck in various implementations).

In various implementations, after the plurality of semiconductor die 36 are immersed in the liquid 46, the method of forming a plurality of semiconductor die may include removing one or more particulates 44 in the die street 28 after singulating the semiconductor substrate through applying sonic energy to the plurality of semiconductor die 36. In various implementations, the sonic energy is applied directly to the liquid 46 through a sonic energy source 48 and is applied to the plurality of semiconductor die 36 through the liquid 46. A wide variety of frequencies may be employed by the source of sonic energy 48 which may range from about 20 kHz to about 3 GHz. Where the sonic frequencies utilized by the ultrasonic energy source 48 are above 360 kHz, the energy source may also be referred to as a megasonic energy source. In particular implementations, the sonic energy source 48 may generate ultrasonic vibrations at a frequency of 40 kHz at a power of 80 W. In various implementations, the sonic energy source 48 may apply a frequency of between about 30 kHz to about 50 kHz or about 35 kHz to about 45 kHz. However, in various implementations, other frequencies higher or and/or lower than 50 kHz may be employed, including megasonic frequencies. A wide variety of power levels may also be employed in various implementations.

The sonic energy source 48 may employ a wide variety of transducer/oscillator designs to generate and transfer the sonic energy to the spindle in various implementations, including, by non-limiting example, magnetostrictive transducers and piezoelectric transducers. In the case where a magnetostrictive transducer/oscillator is utilized, the transducer utilizes a coiled wire to form an alternating magnetic field inducing mechanical vibrations at a desired frequency in a material that exhibits magnetostrictive properties, such as, by non-limiting example, nickel, cobalt, terbium, dysprosium, iron, silicon, bismuth, aluminum, oxygen, any alloy thereof, and any combination thereof. The mechanical vibrations are then transferred to the portion of the ultrasonic energy source that contacts the liquid. Where a piezoelectric transducer/oscillator is employed, a piezoelectric material is subjected to application of electric charge and the resulting vibrations are transferred to the portion of the ultrasonic energy source that contacts the liquid. Example of piezoelectric materials that may be employed in various implementations include, by non-limiting example, quartz, sucrose, topaz, tourmaline, lead titanate, barium titanate, lead zirconate titanate, and any other crystal or material that exhibits piezoelectric properties.

Figure 6:
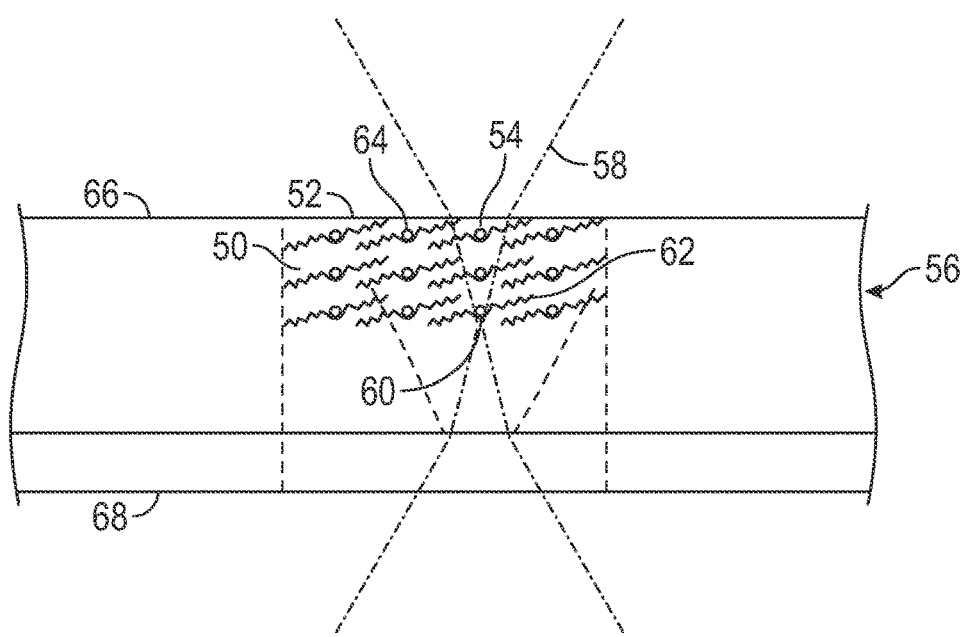
FIG. 6 is cross-sectional side view of a third implementation of a damaged die street in a semiconductor substrate.

Referring to FIG. 6, a cross-sectional side view of a third implementation of a damaged die street in a semiconductor substrate is illustrated. Similar the implementation illustrated by FIG. 1, the method of forming a plurality of semiconductor die may include forming a damage layer 50 beneath a surface 52 of the die street 54 in the semiconductor substrate 56. As illustrated by FIG. 6, the damage layer may be formed using laser irradiation. In implementations where a laser is used, the laser beam 58 may irradiate the material of the street 54 at a focal point 60 beneath the surface 52 of the street 54. Because the laser beam 58 causes localized heating at the focal point 60, the crystalline structure of the material at the focal point is disrupted. In other implementations, the method may include ablating the material, damaging the material, or ablating and damaging the material using a laser. As illustrated by FIG. 6, the semiconductor substrate 56 is silicon carbide.

The degree of damage at the focal point 60 is determined by many factors, including, by non-limiting example, the power of the laser light, the duration of exposure of the material, the absorption of the material of the substrate, the crystallographic orientation of the substrate material relative to the direction of the laser light, the atomic structure of the substrate, and any other factor regulating the absorbance of the light energy and/or transmission of the induced damage or heat into the substrate. The wavelength of the laser light used to irradiate the street 54 is one for which the material of the particular semiconductor substrate is at least partially optically transmissive, whether translucent or transparent. Where the substrate is a silicon carbide substrate, the wavelength may be 1064 nm. In various implementations, the laser light source may be a Nd:YAG pulsed laser or a YVO4 pulsed laser. In one implementation where a Nd:YAG laser is used, a spot size of 10 microns and an average power of 3.2 W may be used along with a repetition frequency of 80 kHz, pulse width of 4 ns, numerical aperture (NA) of the focusing lens of 0.45. In another implementation, a Nd:YAG laser may be used with a repetition frequency of 400 kHz, average power of 16 W, pulse width of 4 ns, spot diameter of 10 microns, and NA of 0.45. In various implementations, the power of the laser may be varied from about 2 W to about 4.5 W. In other implementations, however, the laser power may be less than 2 W or greater than 4.5 W.

As illustrated, the focal point 60 of the laser light forms a location of rapid heating and may result in full or partial melting of the material at the focal point 60. The point of rapid heating and the resulting stress on the hexagonal single crystal structure of the SiC substrate as a result of the heating/cooling results is cracking of the substrate material along a c-plane of the substrate. Depending on the type of single SiC crystal used to manufacture the boule, the c-plane may be oriented at an off angle to the second surface of about 1 degree to about 6 degrees. In various implementations, this angle is determined at the time the boule is manufactured. In particular implementations, the off angle may be about 4 degrees.

During operation, the laser is operated in pulsed operation to create numerous overlapping spots of pulsed light while passing across the surface of the substrate. As a result, a continuous/semi-continuous layer/band of modified material is formed within the wafer. In other implementations, the laser may be operated in continuous wave mode rather than pulsed mode to create the band of modified material. In still other implementations, the damage layer may be formed only near the sides of the die street 54, similar to the implementation illustrated by FIG. 2. As illustrated by FIG. 6, the stress caused by the focal point 60 causes cracking along the c-plane in the material of the street 54 in one or both directions along the c-plane. These cracks 62 are illustrated as spreading from the focal point 60 area (where the modified layer/band is located) angled at the off angle in FIG. 6. In various implementations, the cracks 62 may be located below the focal point 60, above the focal point 60, or spread directly from the focal point 60, depending on the characteristics of the laser and the method of application of the laser to the material. In various implementations, the length of the cracks 62 into the substrate is a function of the power of the laser applied. By non-limiting example, the depth of the focal point was set at 500 um into the substrate; where the laser power was 3.2 W, the crack propagation from the modified layer/band was about 250 um; where the laser power was at 2 W, the crack lengths were about 100 um; where the laser power was set at 4.5 W, the crack lengths were about 350 um.

As illustrated in FIG. 6, the laser beam 58 is in the processing of making a third pass along the street at a third spaced apart location from the two previous passes. In various implementations, one, two, or more passes may be conducted in any street. The various passes may use the same laser parameters and feed speeds/rates or may be conducted using different laser parameters and different feed speeds/rates. The disrupted material and cracks from the laser irradiation form a damage layer beneath the surface 52 of the street 54. The damage layer breaks up the structure of the semiconductor substrate material (in the case of SiC, the hexagonal crystalline structure of the substrate) thereby weakening the strength of the material. Other focal points 64 like focal point 60 are illustrated that are a different depth into the material of the street 54 (distance beneath the surface 52 of the street 54). In this way, multiple damage layers can be formed within the material of the street 54. Generally, the damage layer at the deepest depth into the material of the street would be formed first, followed by the next damage layer, and so forth. However, in other implementations, the reverse may be done, particularly where the focal points do not directly overlap each other but are staggered instead. As illustrated, the irradiation is being conducted from the back side 66 of the substrate, or the side of the substrate that is opposite the side on which the semiconductor devices have been formed (device side 68). In other implementations, however, depending on the material in the street, the laser irradiation can be performed from the device (front) side 68 of the substrate, similar to the implementation illustrated by FIG. 1. Where laser irradiation is conducted from the back side 66 of the substrate 56, the use of back side cameras to align the wafer using the device side of the wafer may be used to align the wafer to ensure that the laser irradiation is properly aligned with the streets themselves and avoids the area of the plurality of die.

Figure 7:
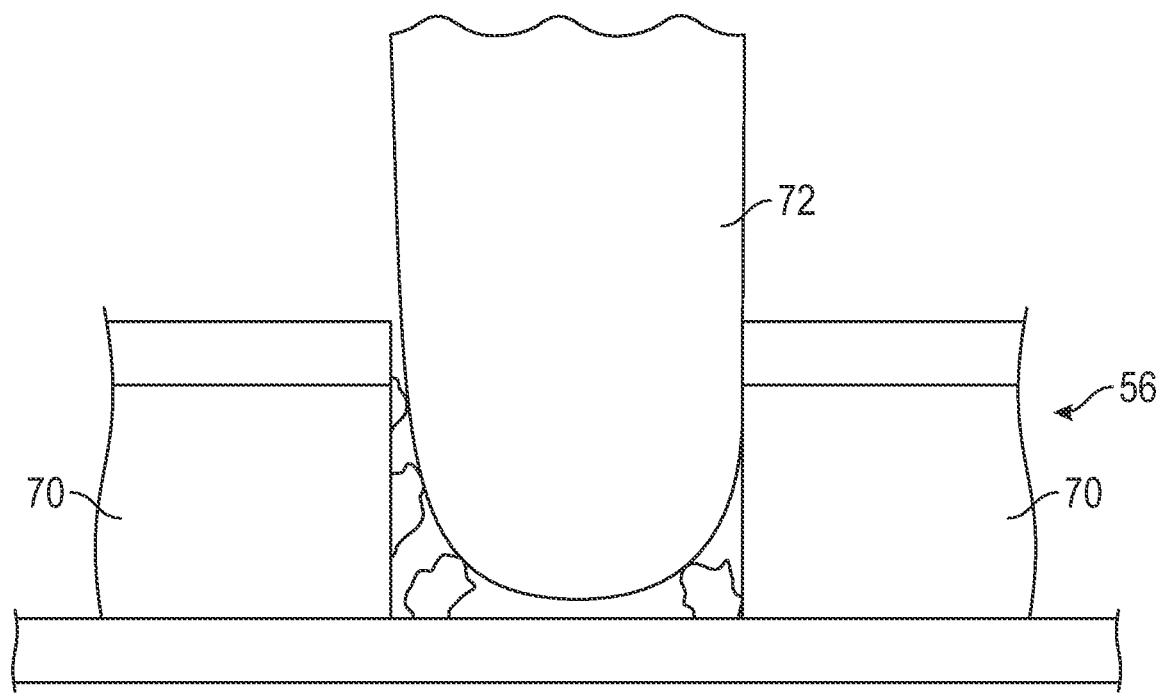
FIG. 7 is a cross-sectional side view of a saw cutting through the die street of FIG. 6.

Referring to FIG. 7, a cross-sectional side view of a saw cutting through the die street of FIG. 6 is illustrated. The method of forming a plurality of semiconductor die may include singulating the semiconductor substrate 56 into a plurality of semiconductor die 70. The semiconductor substrate 56 may be singulated using any method disclosed herein. As illustrated by FIG. 7, a saw blade 72 may be used to remove the material of the die street. The saw blade 72 may be any type of saw blade previously disclosed herein, including a saw blade having diamond grit, or, as illustrated, a saw blade without diamond grit.

Figure 8:
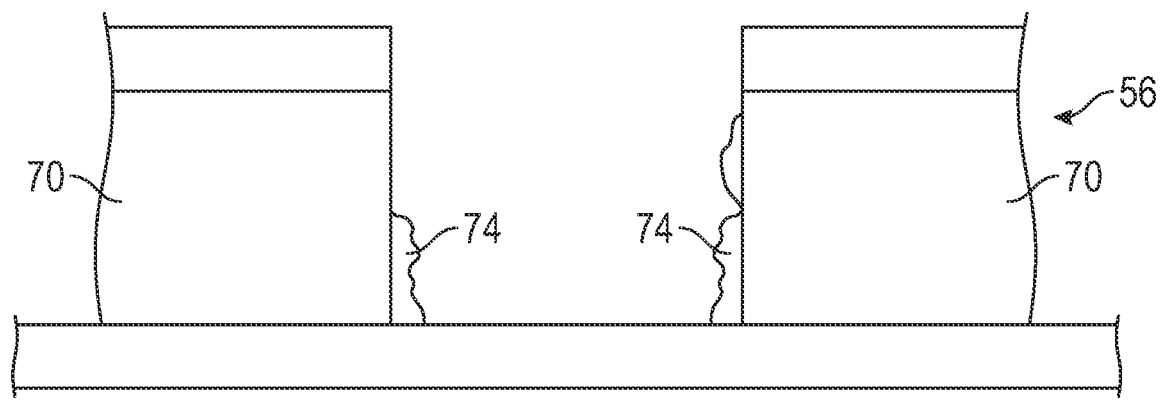

Referring to FIG. 8, a cross-sectional side view of a semiconductor substrate after having been singulated using a saw blade is illustrated. Upon singulating the semiconductor substrate 56, one or more particulates/slivers/chips 74 may be coupled to the sidewalls of the plurality of semiconductor die. The particulates 74 may be remnants of the die street 28, tape, backmetal, or any other contaminant or material. These particulates 74 may be removed using any method disclosed in this document.

Figure 9:
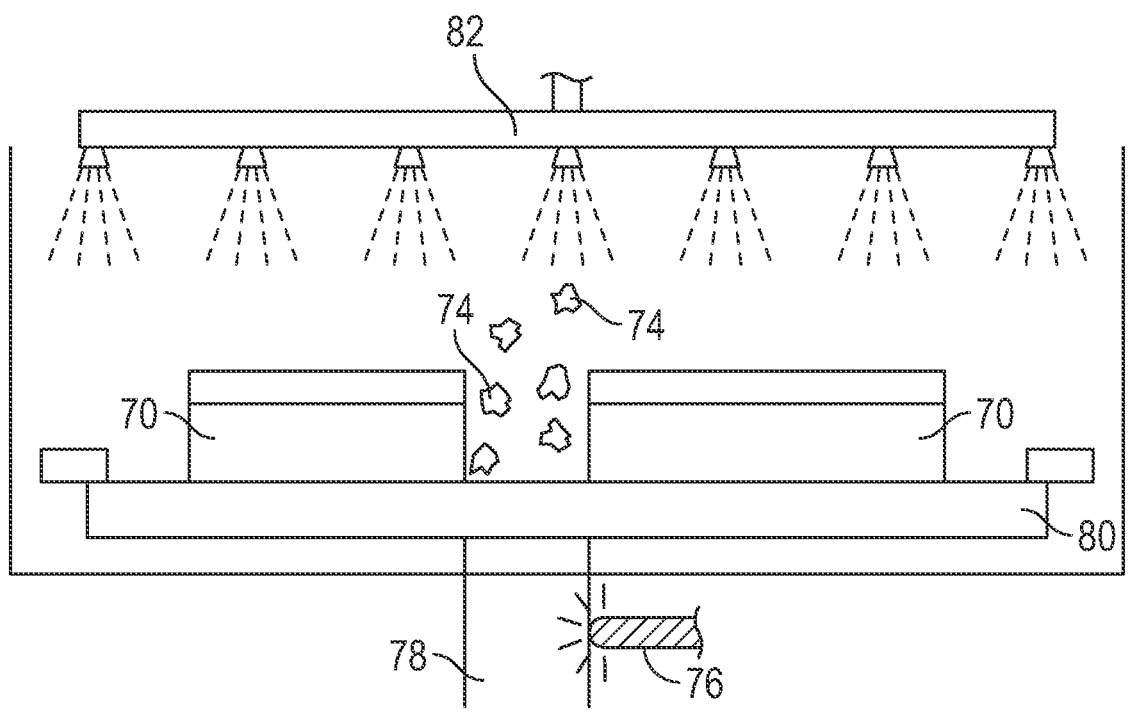
FIG. 9 is a cross-sectional side view of a semiconductor substrate subjected to sonic energy while being sprayed with a liquid.

Referring to FIG. 9, a cross-sectional side view of a semiconductor substrate subjected to sonic energy while being sprayed with a liquid is illustrated. In order to remove the particulates 74, the method of forming a plurality of semiconductor die 70 may include applying a sonic energy to the plurality of semiconductor die 70. In various implementations, a source 76 of the sonic energy may directly apply the energy to a spindle 78 coupled to the chuck 80 or platform supporting the semiconductor substrate 56. In this manner, the sonic energy is applied to the substrate 56 through the chuck 80. In such implementations, the semiconductor substrate may be either be immersed in a liquid as previously described herein, or, as illustrated by FIG. 9, the method may include spraying the semiconductor substrate 56 with liquid from a sprayer 82 while the sonic energy is applied to the semiconductor substrate. The combination of the sonic energy with the spray may remove the one or more particulates 74 from the sidewalls of the plurality of semiconductor die 70. The spray may be any liquid, including, by non-limiting example, water, surfactant, a combination of water and surfactant, and/or any other solvent and/or solute disclosed in this document.

In places where the description above refers to particular implementations of semiconductor die and implementing components, sub-components, methods and sub-methods, it should be readily apparent that a number of modifications may be made without departing from the spirit thereof and that these implementations, implementing components, sub-components, methods and sub-methods may be applied to other semiconductor die.

What is claimed is:
1. A method of forming a plurality of semiconductor die, the method comprising:
forming a damage layer beneath a surface of a die street in a semiconductor substrate using a laser;

ablating only a portion of material of the die street using the laser;
singulating the semiconductor substrate into a plurality of semiconductor die through sawing along the die street;
immersing the plurality of semiconductor die in a liquid; and
removing one or more particulates in the die street after singulating through applying sonic energy to the plurality of semiconductor die while immersed;
wherein the sonic energy is applied directly to a spindle coupled with a chuck and transmitted to the chuck through the spindle, wherein the semiconductor substrate is upon the chuck.

2. The method of claim 1, wherein the semiconductor substrate is silicon carbide.

3. The method of claim 1, wherein forming a damage layer further comprises irradiating the die street with a laser beam at a focal point within the semiconductor substrate at one or more spaced apart locations beneath the surface of the die street to form the damage layer.

4. The method of claim 1, wherein forming a damage layer further comprises:
irradiating the die street with a laser beam at a focal point at a first depth within the semiconductor substrate at one or more spaced apart locations beneath the surface of the die street; and
irradiating the die street with a laser beam at a focal point at a second depth within the semiconductor substrate at one or more spaced apart locations beneath the surface of the die street.

5. The method of claim 4, wherein the first depth is deeper than the second depth.

6. The method of claim 5, wherein irradiating the die street at the first depth is prior to irradiating the die street at the second depth.

7. The method of claim 1, wherein the sonic energy is applied to the spindle after singulating the semiconductor substrate.

8. The method of claim 1, wherein applying sonic energy further comprises applying sonic energy between 20 kHz to 3 GHz.

9. A method of forming a plurality of semiconductor die, the method comprising:
irradiating a semiconductor substrate with a laser beam at a focal point below a die street to form a damage layer;
scribing the semiconductor substrate along the die street using a stylus;
sawing the semiconductor substrate along the die street into a plurality of semiconductor die;
immersing the plurality of die in a liquid; and
removing one or more particulates in the die street after sawing through applying sonic energy to the plurality of semiconductor die while immersed;
wherein the sonic energy is applied directly to a spindle coupled with a chuck and transmitted to the chuck through the spindle, wherein the semiconductor substrate is upon the chuck.

10. The method of claim 9, wherein applying sonic energy further comprises applying sonic energy between 20 kHz to 3 GHz.

11. The method of claim 9, wherein the semiconductor substrate is silicon carbide.

12. The method of claim 9, wherein scribing the semiconductor substrate forms a crack that propagates only partially through the die street.

13. The method of claim 9, wherein irradiating the semiconductor substrate further comprises:
irradiating the die street with a laser beam at a focal point at a first depth within the semiconductor substrate at one or more spaced apart locations beneath a surface of the die street; and
irradiating the die street with a laser beam at a focal point at a second depth within the semiconductor substrate at one or more spaced apart locations beneath the surface of the die street.

14. The method of claim 9, further comprising applying sonic energy to a saw blade while cutting the semiconductor substrate.

15. A method of forming a plurality of semiconductor die, the method comprising:
singulating a silicon carbide semiconductor substrate along a die street into a plurality of semiconductor die;
immersing the plurality of die in a liquid;
applying sonic energy to the silicon carbide semiconductor substrate, while immersed, through directly applying sonic energy to a spindle coupled with a chuck, the chuck coupled to the silicon carbide semiconductor substrate; and
removing one or more particulates in the die street after singulating the silicon carbide semiconductor substrate through applying sonic energy to the plurality of semiconductor die.

16. The method of claim 15, wherein applying sonic energy further comprises applying sonic energy between 20 kHz to 3 GHz.

17. The method of claim 15, wherein the sonic energy is megasonic energy.

18. The method of claim 15, wherein the semiconductor substrate is singulated using stealth dicing.

19. The method of claim 15, further comprising forming a damage layer beneath a surface of the die street using a laser, ablating a portion of material of the die street using the laser, and singulating the semiconductor substrate using a saw.

20. The method of claim 15, wherein applying sonic energy further comprises applying sonic energy at 40 KHz.

* * * * *